US006985051B2

(12) United States Patent
Nguyen et al.

(10) Patent No.: US 6,985,051 B2
(45) Date of Patent: Jan. 10, 2006

(54) MICROMECHANICAL RESONATOR DEVICE AND METHOD OF MAKING A MICROMECHANICAL DEVICE

(75) Inventors: Clark T.-C. Nguyen, Arlington, VA (US); Mohamed A. Abdelmoneum, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 90 days.

(21) Appl. No.: 10/737,363

(22) Filed: Dec. 16, 2003

(65) Prior Publication Data

US 2004/0207492 A1   Oct. 21, 2004

Related U.S. Application Data

(60) Provisional application No. 60/434,185, filed on Dec. 17, 2002.

(51) Int. Cl.
*H03H 9/02* (2006.01)
*H03H 9/46* (2006.01)
*H03H 9/48* (2006.01)

(52) U.S. Cl. .................................. 333/186; 333/199
(58) Field of Classification Search ........ 333/186–192, 333/197–199; 310/309
See application file for complete search history.

(56) References Cited

U.S. PATENT DOCUMENTS

| | | | |
|---|---|---|---|
| 3,612,922 A | 10/1971 | Furnival | 310/351 |
| 5,194,836 A | 3/1993 | Vale et al. | 333/133 |
| 5,198,716 A * | 3/1993 | Godshall et al. | 310/349 |
| 6,369,374 B1 | 4/2002 | Greywall | 250/201.1 |
| 6,563,400 B2 * | 5/2003 | Itasaka et al. | 333/187 |
| 6,628,177 B2 * | 9/2003 | Clark et al. | 333/186 |
| 6,734,762 B2 * | 5/2004 | Cornett et al. | 333/186 |
| 6,856,217 B1 * | 2/2005 | Clark et al. | 333/186 |

OTHER PUBLICATIONS

T. Fujita et al., "Disk-Shaped Bulk Micromachined Gyroscope With Vacuum Sealing", Elsevier Sensors and Actuators, vol. 82, May 2000, pp. 198-204.*
Y. Xie et al., "UHF Micromechanical Extensional Wine-Glass Mode Ring Resoantors", 2003 IEEE International Electron Devices Meeting Technical Digest, pp. 39.2.1-39.2.4, Dec. 2003.*
Wang, Kun, et al., VHF Free—Free Beam High-Q Micromechanical Resonators, Journal of Microelectromechanical Systems, vol. 9, No. 3, Sep. 2000, pp. 453-458.
Onoe, M., Contour Vibrations of Isotropic Circular Plates, The Journal of the Acoustical Society of America, vol. 28, No. 6, Nov. 1954, pp. 1158-1162.
Pourkamali, S., et al., A 600 KHz Electrically-Coupled MEMS Bandpass Filter, Dig. Of Papers Int. Conf. of Microelectromechanical Systems, MEMS 2003, Japan, Jan. 2003, pp. 702-705.
Nguyen, Clark, T.-C., Microelectromechanical Components For Miniaturized Low-Power Communications, Proceedings, 1999 IEEE MTT-S International Microwave Symposium RF MEMS Workshop, Anaheim, California, Jun. 18, 1999, pp. 48-77.
Nguyen, Clark, T.-C., Micromechanical Circuits For Communication Tranceivers, Proceedings, 2000 Bipolar/BiCMOS Circuits and Technology Meeting (BCTM), Minneapolis, Minnisota, Sep. 25-26, 2000, pp. 142-149.

(Continued)

*Primary Examiner*—Barbara Summons
(74) *Attorney, Agent, or Firm*—Brooks Kushman P.C.

(57) ABSTRACT

A micromechanical resonator device and a method of making the micromechanical resonator device, as well as other extensional mode devices are provided wherein anchor losses are minimized by anchoring at one or more side nodal points of the resonator device. Lower damping forces are experienced by the resonator device when operated in air.

21 Claims, 5 Drawing Sheets

OTHER PUBLICATIONS

Tang, William C., et al., Laterally Driven Polysilicon Resonant Microstructures, Sensors and Actuators, vol. 20, 1989, Abstract only.

Nguyen, Clark, T.-C., An Integrated CMOS Micromechanical Resonator High-Q Oscillator, IEEE Journal of Solid-State Circuits, vol. 34, No. 4, Apr. 1999, pp. 440-455.

Wang, Kun, et al., High-Order Medium Fequency Micromechanical Electronic Filters, IEEE, Journal of Microelectromechanical Systms, vol. 8, No. 4, Dec. 1999, pp. 534-557.

Bannon, Frank D., et al., High-Q HF Microelectromechanical Filters, IEEE Journal of Solid-State Circuits, vol. 35, No. 4, Apr. 2000, pp. 512-526.

Lee, Seungbae, et al., A 10-MHz Micromechanical Resonator Pierce Reference Oscillator for Communications, Digest of Technical Papers, Transducers 2001, Munich, Germany, Jun. 10-14, 2001, pp. 1094-1097.

Clark, John R., et al., High-Q VHF Micromechanical Contour-Mode Disk Resonators, Technical Digest, IEEE Int. Electron Devices Meeting, (IEDM), San Francisco, California, Dec. 11-13, 2000, pp. 493-496.

Wong, Ark Chew, et al., A Bonded Microplatform Technology for Modular Merging of RF MEMS and Transfer Circuits, Digest of Papers Int. -Conf. on Solid-State Sensors and Actuators, Transducers 2001, Jun. 10-14, 2001.

Abdelmoneum, Mohamed A., et al., Stemless Wine-Glass-Mode Disk Micromechanical Resonators, Digest of Papers Int. Conference of Microelectromechanical Systems (MEMS 2003), Jan. 2003, Kyoto, Japan, pp. 698-701.

Hsu, Wan-Thai, et al., A Sub-Micron Capacitive-Gap Process For Multiple-Metal-Electrode Lateral Micromechanical Resonators, Technical Diges, IEEE Int. Micromechanical Systems Conf., Interlaken, Switzerland, Jan. 21-25, 2001, pp. 349-352.

Wake, R. N., et al., Changes In The Natural Frequencies of Repeated Mode Pairs Induced By Cracks In A Vibrating Ring, IEEE Journal of Sound and Vibration, vol. 214, No. 4, Nov. 1998, pp. 761-770.

DeMirci, Mustafa U., et al., Mechanically Corner-Coupled-Square Microresonator Array For Reduced Series Motional Resistance, Digest of Papers Int. Conf. on Solid-State Sensors and Actuators, Transducers 2003, Jun. 8-12, 2003.

Clark, John R., et al., High-Q UHF Micromechanical Radial-Contour Mode Disk Resonators, submitted for publication in IEEE Journal of Microelectromechanical Systems on Apr. 29, 2003, pp. 1-10.

* cited by examiner

MICROMECHANICAL RESONATOR DEVICE AND METHOD OF MAKING A MICROMECHANICAL DEVICE

CROSS-REFERENCE TO RELATED APPLICATION

This application claims the benefit of U.S. provisional application Ser. No. 60/434,185, filed Dec. 17, 2002 and entitled "Non-Intrusively Supported Wine Glass Disk Resonator."

STATEMENT REGARDING FEDERALLY SPONSORED RESEARCH OR DEVELOPMENT

This invention was made with Government support under DARPA Grant No. F30602-97-2-0101 and Contract 040455 from NSF ERC. The Government has certain rights in the invention.

BACKGROUND OF THE INVENTION

1. Field of the Invention

This invention relates to micromechanical resonator devices and methods of making a micromechanical device.

2. Background Art

The following references are referenced herein:

[1] C. T.-C. Nguyen, "Microelectromechanical Components for Miniaturized Low-Power Communications,"/it Proceedings, IEEE MTT-S INTERNATIONAL MICROWAVE SYMPOSIUM RF MEMS WORKSHOP, Anaheim, Calif., Jun. 18, 1999, pp. 48–53.

[2] C. T.-C. Nguyen, "Micromechanical Circuits for Communication Transceivers," /it Proceedings, 2000 BCTM, Minneapolis, Minn., Sep. 25–26, 2000, pp. 142–149.

[3] W. C. Tang et al., "Laterally Driven Polysilicon Resonant Microstructures," SENSORS ACTUATORS, Vol. 20, pp. 25–32, 1989.

[4] C. T.-C. Nguyen et al., "An Integrated CMOS Micromechanical Resonator High-Q Oscillator," IEEE JOURNAL OF SOLID STATE CIRCUITS, Vol. 34, No. 4, pp. 440–455, April, 1999.

[5] K. Wang et al., "High-Order Medium Frequency Micromechanical Electronic Filters," JOURNAL OF MICROELECTROMECHANICAL SYSTEMS, Vol. 8, No. 4, pp. 534–557, December 1999.

[6] F. D. Bannon et al., "High-Q HF Microelectromechanical Filters," IEEE JOURNAL OF SOLID-STATE CIRCUITS, Vol. 35, No. 4, pp. 512–526, April, 2000.

[7] S. Lee et al., "A 10-MHz Micromechanical Pierce Reference Oscillator for Communications," DIGEST OF TECHNICAL PAPERS, TRANSDUCERS '01, Munich, Germany, Jun. 10–14, 2001, pp. 1094–1097.

[8] K. Wang et al., "VHF Free-Free Beam High-Q Micromechanical Resonators," JOURNAL OF MICROELECTROMECHANICAL SYSTEMS, Vol. 9, No. 3, pp. 347–360, September, 2000.

[9] J. R. Clark et al., "High-Q VHF Micromechanical Contour-Mode Disk Resonators," TECHNICAL DIGEST, IEEE INT. ELECTRON DEVICES MEETING, (IEDM), San Francisco, Calif., Dec. 11–13, 2000, pp. 493–496.

[10] A. C. Wong et al., "A Bonded-Micro-Platform Technology for Modular Merging of RF MEMS and Transistor Circuits," DIG. OF PAPERS INT. CONF. ON SOLID-STATE SENSORS & ACTUATORS (TRANSDUCERS '01), Jun. 10–14, 2001.

[11] M. Onoe, "Contour Vibrations of Isotropic Circular Plates," THE JOURNAL OF THE ACOUSTICAL SOCIETY OF AMERICA, Vol. 28, No. 6, pp. 1158–1162, November 1954.

[12] M. Abdelmoneum et al., "Stemless Wine-Glass-Mode Disk Micromechanical Resonators," DIG. OF PAPERS INT. CONF. OF MICRO ELECTRO MECHANICAL SYSTEMS (MEMS 2003), pp. 698–701, Kyoto, Japan, January 2003.

[13] W. T.-Hsu et al., "A Sub-Micron Capacitive Gap Process for Multiple-Metal-Electrode Lateral Micromechanical Resonators," TECHNICAL DIG. IEEE INT. MICRO MECHANICAL SYSTEMS CONF., Interlaken, Switzerland, pp. 349–352, Jan. 21–25, 2001.

[14] R. N. Wake et al., "Changes in the Natural Frequencies of Repeated Mode Pairs Induced by Cracks in a Vibrating Ring," IEEE JOURNAL OF SOUND AND VIBRATION, Vol. 214, No. 4., pp. 761–70, November 1998.

[15] A. I. Zverev, "Handbook of Filter Synthesis," New York: Wiley, 1967.

[16] S. Pourkamali et al., "A 600 KHz Electrically-Coupled MEMS Bandpass Filter," DIG. OF PAPERS INT. CONF. OF MICRO ELECTRO MECHANICAL SYSTEMS (MEMS 2003), pp. 702–705, Kyoto, Japan, January 2003.

[17] M. Demirci et al., "Mechanically Corner-Coupled Square Microresonator Array for Reduced Motional Resistance," DIG. OF PAPERS INT. CONF. ON SOLID-STATE SENSORS & ACTUATORS (TRANSDUCERS '03), Jun. 8–12, 2003.

[18] J. Clark et al., "High-Q UHF Micromechanical Radial-Contour Mode Disk Resonators," Submitted for publication in IEEE JOURNAL OF MICROELECTROMECHANICAL SYSTEMS.

The following U.S. patents are related to the invention: U.S. Pat. Nos. 3,612,922; 5,194,836; and 6,369,374.

The reference T. Fujita et al., "Disk-Shaped Bulk Micromachined Gyroscope with Vacuum Sealing," SENSORS AND ACTUATORS, pp. 198–204, Vol. 82, May 2000 is also related to the invention.

Vibrating Micro Electro Mechanical (MEM) resonators have emerged as leading candidates to replace bulky off-chip components in portable communication systems [1, 2]. Transceiver components can be divided into high density compact size Integrated Circuits (ICs) and bulky size off-chip filters, mixers and oscillators. The off-chip components incorporate crystal or Surface Acoustic Wave (SAW) resonators. The fabrication process of these off-chip components is not compatible with IC fabrication technology and that is why they are assembled with the ICs on the PCB. Such as combination between off-chip components and ICs increases manufacturing costs and size of the overall system. In addition to the size of these off-chip components, they introduce significant insertion losses to the already low power received signal, and they require continuous DC bias for their operation and so consume more power. The received signal, after losing some of its power in the passive off-chip components, cannot be further processed without amplification to increase its power level. Amplifier stages that are usually added after the off-chip components increase the system cost and power requirement. The power consumption effects the battery life and size. If this power consumption can be reduced, then, for the same battery size, longer operational time can be achieved, or, for the same operational time, a smaller-size battery can be used.

Vibrating micromechanical resonators are characterized by zero power consumption and low insertion loss making them an attractive choice to replace off-chip components and improve the system size and cost. A vibrating Micro Electro Mechanical (MEM) resonator is a vibration structure that vibrates only at the natural frequency of the structure. A simple Clamped-Clamped beam resonator has a static DC bias applied to a capacitive gap formed between the input electrode and the body of the beam connected to the output electrode. When the frequency of the input AC signal applied to the capacitive gap through the input electrode matches the natural frequency of the beam structure, the beam starts vibrating creating a time variable capacitor. The applied DC bias across this time variant capacitor will result in a modulated output current having the same frequency as the input AC signal.

The equivalent electrical circuit of a vibrating MEM resonator can be simplified as a series RLC tank circuit Tank circuits are the basic building blocks in filters and oscillators. Several MEM resonators have been developed earlier and demonstrated in filters and oscillators. Comb resonator developed by Tang et al. [3] has been used to demonstrate a high Q MEMS oscillator [4] and MEMS filters [5]. However, the operational frequency of these comb resonators is limited to several tens of KHz. For higher operational frequencies, Clamped-Clamped beam resonators are used. Clamped-Clamped beam filters and oscillators have been demonstrated [6, 7] at frequencies up to 10 MHz. Free-Free beam micromechanical resonators shown in U.S. Pat. No. 6,249,073 were developed to reduce anchor losses at higher frequencies up to about 70 MHz [8]. Radial mode disk resonators developed later by J. Clark et al. [9] shown in U.S. Pat. No. 6,628,188 were considered ground breaking as they extended the operational frequencies of micromechanical resonators up to several hundreds of MHz and possibly to the GHz range. These developed micromechanical resonators are characterized by:

Very small size (an order of a thousand times smaller than off-chip components);
Zero power consumption;
Low insertion loss;
Fabrication process that is compatible with IC technology; and
Has strong potential to be integrated on chip [10].

By demonstrating these advantages, vibrating micromechanical resonators encouraged system designers to start thinking about integrating an entire transceiver on a single chip. However, the developed resonators suffered from:

The need for strict vacuum packaging to maintain their high quality factors (Q's);
High DC bias voltage that requires an additional charge pump to generate this voltage from the low DC bias levels available in a portable system;
High motional resistance which requires complex matching networks to match it to 50Ω systems;
Need a fabrication process to integrate them with circuits [10]; and
Require post fabrication trimming to tune the resonance frequency.

In particular, vacuum packaging and high DC bias requirement made the industry reluctant to invest in RF MEMS as it appeared to be still at an early development stage. Without resolving these two main issues, commercial production of vibrating RF MEMS will not be feasible.

Anchor losses are the dominant loss mechanism that affects Q when the resonator operates in vacuum. When operating in atmosphere, in addition to anchor losses, air damping forces create more losses and hence further reduction in Q.

Anchor losses occur when the resonator is anchored at a finite size quasi nodal surface/point. For a clamped-clamped beam, the nodal surface area is relatively large. That is why the Q goes down significantly by increasing the beam width and hence the anchor size.

In atmosphere, air damping forces add more losses to the existing anchor losses. The atmospheric pressure $P_{air}$ will create a damping force $F_{damping}$ on the resonator given by:

$$F_{damping} = P_{air} A_{moving} \qquad (1)$$

where $A_{moving}$ is the area of the moving portion of the resonator surface. This damping force can be reduced by minimizing $A_{moving}$. The resonator will lose part of its kinetic energy equal to the work W done to oppose the damping force $F_{damping}$ is given by:

$$W = F_{damping} d_{effective} = P_{air} A_{moving} d_{effective} \qquad (2)$$

where $d_{effective}$ is the effective displacement of the resonator. The lost energy can be further reduced by reducing the resonator effective displacement. The stiffer the resonator the less this displacement and hence the less energy lost to the air damping force.

Understanding the factors that effectively reduce the resonator Q and deteriorate its performance in air, there is a need for a resonator that:

Uses an anchoring structure that can be assumed to be infinitely thin and located at real nodal points;
Has a small moving area; and
Is stiffer than clamped-clamped beam resonators.

These requirements can be satisfied to some extent by the radial mode disk resonator developed by J. Clark et al., [9] except for the zero size anchor as it uses a finite size central stem. This finite size stem becomes a route for kinetic energy which is transferred from the resonator to the substrate and hence reduces the overall Q.

The wine-glass mode is the lowest order vibration mode for infinitely thin circular structures [11]. It is characterized by having two orthogonal nodal axes as shown in the FEM mode shape presented in FIG. 4 wherein nodal points are indicated at 8. Unlike the radial mode disk resonator [9] characterized by its radial displacement only, the wine-glass mode is a compound mode that involves both aerial dilation and rotation. The magnitude of the tangential displacement is smaller than the magnitude of the radial displacement by a factor of about three times. Also, the nodal points have zero radial displacement and maximum tangential displacement. Furthermore, the magnitude of the radial displacement at a finite distance (about 2 μm) from the nodal point is about one thousandth of the magnitude of the peak radial displacement.

SUMMARY OF THE INVENTION

An object of the present invention is to provide a micromechanical resonator device and a method of making a micromechanical device wherein anchor losses are minimized by anchoring at one or more side nodal points of the resonator device and lower damping forces are experienced by the resonator device when operated in air.

In carrying out the above object and other objects of the present invention, a micromechanical resonator device having a desired mode shape is provided. The device includes a substrate and a resonator having a stationary surface area. The desired mode shape is characterized by a plurality of peripheral nodal points located about a periphery of the resonator. The desired mode shape involves movement of only a fraction of the stationary surface area at resonance. A non-intrusive support structure is anchored to the substrate to support the resonator above the substrate and attached to the resonator at at least one of the peripheral nodal points to reduce mechanical losses to the substrate.

The device may further include a drive electrode structure adjacent the resonator for driving the resonator so that the resonator changes shape at resonance.

The resonator may be an extensional mode device having a compound mode that involves both radial and tangential displacements.

The resonator may be a disk resonator or a ring resonator. The disk resonator may be a solid disk resonator.

The non-invasive support structure may force the resonator to vibrate in the desired mode shape while suppressing any undesired mode shapes.

The desired mode shape may be a compound mode shape such as a wine-glass mode shape or a triangular mode shape.

The device may further include a drive electrode structure formed on the substrate at a position to allow electrostatic excitation of the resonator so that the resonator is driven in the desired mode shape. The resonator and the drive electrode structure may define a capacitive gap therebetween. The capacitive gap may be a sub-micron, lateral, capacitive gap.

The drive electrode structure may be disposed about the periphery of the resonator, and the desired mode shape may be a wine-glass mode shape.

The drive electrode structure may include a plurality of split electrodes.

The desired mode shape may be further characterized by a central nodal point which corresponds to a center of the resonator. The central nodal point and a pair of the peripheral nodal points are disposed on a nodal axis having substantially no radial displacement at resonance.

The support structure may include a plurality of anchors positioned about the periphery of the resonator.

The device may further include a sense electrode structure formed on the substrate at a position to sense output current based on motion of the resonator.

The drive electrode structure may include a plurality of separate input drive electrodes and the sense electrode structure may include a plurality of separate output sense electrodes.

The device may be diamond-based, silicon carbide-based or silicon-based, or a composite material having high acoustic velocity.

The desired mode shape may be a triangular disk mode shape or a wine-glass ring mode shape.

Further in carrying out the above object and other objects of the present invention, a method of making a micromechanical device is provided. The device includes a first structure and a non-intrusive support structure attached to the first structure at at least one anchoring point. The method includes providing a substrate, and forming the first structure on the substrate. The method further includes forming the non-invasive support structure anchored to the substrate to support the first structure above the substrate. The at least one anchoring point is defined substantially simultaneously with formation of the first structure to insure that the at least one anchoring point is precisely located relative to the first structure.

Still further in carrying out the above object and other objects of the present invention, a method of making a micromechanical resonator device having a desired mode shape is provided. The device includes a resonator and a non-intrusive support structure attached to the resonator at at least one anchoring point. The desired mode shape is characterized by a plurality of peripheral nodal points located about a periphery of the resonator. The method includes providing a substrate, and forming the resonator on the substrate. The method further includes forming the non-invasive support structure anchored to the substrate to support the resonator above the substrate. The at least one anchoring point is defined substantially simultaneously with formation of the resonator to insure that the at least one anchoring point is precisely located at one of the peripheral nodal points.

The resonator may be a ring resonator having inner and outer peripheries wherein the drive electrode structure includes inner and outer sets of electrodes disposed about the inner and outer peripheries, respectively.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENTS

Figure 3:
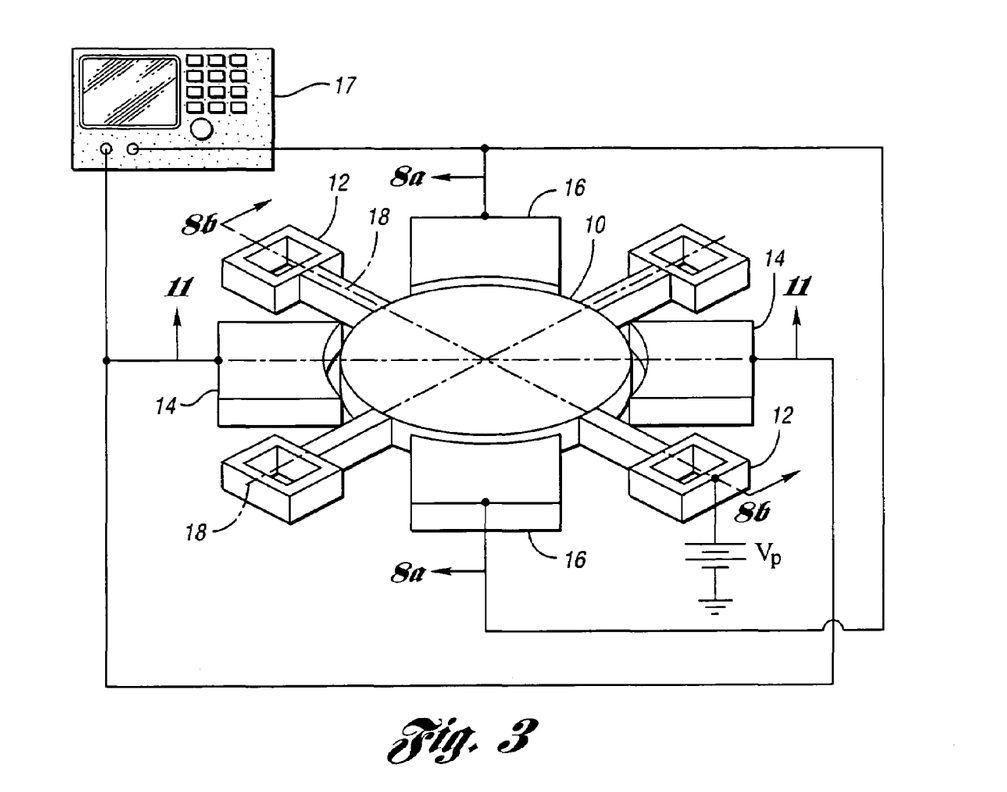
FIG. 3 is a perspective, schematic view of a stemless wine-glass mode disk resonator with four anchors in the typical bias and excitation configuration.

In one embodiment of a micromechanical resonator device of the present invention, a disk is anchored at the side nodal points using a finite size anchor with absolute zero radial displacement at the side anchors. In contrast to finite size side anchors, a central anchor will not be a real nodal point as it will involve significant radial and tangential displacements. A perspective view of one embodiment of the invention in the form of a wine-glass mode disk resonator 10 with the associated anchoring structure and split electrode configuration is shown in FIG. 3. While four anchors 12 are shown in FIG. 3, it is to be understood that one, two or three anchors could be used without departing from the teachings of the present invention.

The proposed device is anchored using a novel non-intrusive structure strategically located at real nodal points with almost zero radial displacement. The effect of the tangential displacement is minimized by adjusting the size of the anchor and length of the anchoring beam. The split electrode configuration is used to setup the required electric forces between the drive electrodes 14 and the disk body 10. These electric forces that match the wine-glass mode shape will excite only this specific mode.

The proposed wine-glass mode disk resonator is characterized by:
- Non-intrusive anchor structure that brings anchor losses to a minimum and hence is expected to enhance the overall Q in vacuum.
- Small effective moving area that is smaller by a factor of about eight times than radial mode disk resonators and about eighty time smaller than clamped-clamped beam resonators. This is expected to have significant effect on Q when the device operates in air.
- Smaller size anchoring structure compared to the center stem for the radial mode disk and the end anchors for clamped-clamped beams leading to better thermal isolation from the substrate and hence better thermal stability.
- Larger volume that will reflect on its power handling capability and hence linearity.

Device Operation

Figure 4:
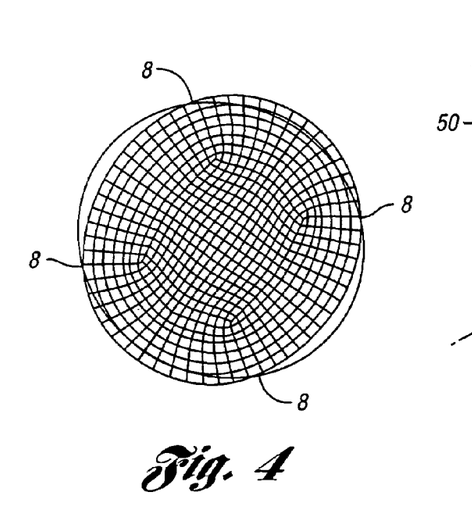
FIG. 4 is a wine-glass mode shape simulated by the FEM ANSYS package.

Unlike the radial contour mode disk resonator which is characterized by aerial dilation only, the wine-glass vibration mode involves both aerial dilation as well as rotation as shown in FIG. 4. To maintain a symmetric excitation and sense configuration, a split electrode architecture is used. Such a configuration in a typical bias and test setup is presented in FIG. 3 including the input or drive electrodes 14 as well as output or sense electrodes 16. Nodal axes are indicated at 18. A network analyzer is indicated at 17.

To operate the device, a DC bias voltage $V_p$ is applied to the disk structure through the anchors 12, while an AC input is applied to one set of the symmetric electrodes 14 shown in FIG. 3, the other transverse set of electrodes 16 is used to sense the output current. The AC input signal creates a time varying force between the electrode 14 and the disk body 10. When this time varying force is at the device mode frequency, the force is amplified by the quality factor Q and causes the disk 10 to vibrate in the appropriate mode shape shown in FIG. 4. The displacement of the disk 10 against the sense electrodes 16 creates a time varying capacitor. The applied DC bias across this time varying capacitor generates an AC output current given by:

$$i_o = V_p \frac{\delta C}{\delta x} \frac{\delta x}{\delta t} \quad (3)$$

where x is the mode displacement at the edge of the disk 10, $$\frac{\delta C}{\delta x}$$

is the change in electrode-to-disk capacitance per unit displacement and $$\frac{\delta x}{\delta t}$$

is the mode vibration velocity at the disk outer diameter. This current is then sensed across the termination resistance which, for the present case, is the 50 Ω characteristic impedance of the network analyzer 17. Being operating at a lower order mode than the radial contour mode device, the wine-glass mode is expected to operate at much lower DC bias voltages, thus alleviating the need for a charge pump required to get an on-chip high DC bias voltages.

Mechanical Design and Equivalent Electrical Circuit

For many practical applications, one of the first specifications to be defined is the device operating frequency. Given the specified frequency of operation $f_o$, the wine-glass mode radius can be computed from the mode frequency equation (4) [11] given by:

$$\left[\Psi_2\left(\frac{\zeta}{\xi}\right) - 2 - q\right]\left[2\Psi_2(\zeta) - 2 - q\right] = (nq - n)^2 \quad (4)$$

where $$q = \frac{\zeta^2}{2n^2 - 2}, \quad \zeta = R\sqrt{\frac{2\rho w_o^2(1+\sigma)}{E}} \quad \text{and} \quad \xi = \sqrt{\frac{2}{1-\sigma}},$$

R is the disk radius, ρ is the disk material density, $w_o = 2\pi f_o$ is the angular frequency, σ is Poisson's ratio and E is Young's modulus of elasticity. The frequency equation is solved for ζ and hence the disk radius R can be computed. It should be mentioned that the FEM modal analysis of the designed disk has been performed using the ANSYS commercial package and the result is shown in FIG. 4. It should be mentioned that the mode frequency obtained by the FEM analysis matched the theoretical predicted frequency. The disk thickness t is dictated to some extent by the technology, the target thickness is 2 μm for the present case. Being able to compute the disk radius as well as the thickness based on the required operating frequency, the mechanical circuit elements, that is the equivalent mass, effective spring constant and damping are then calculated.

As mentioned, the WG (i.e., wine-glass) mode is a compound mode characterized by having both radial and tangential displacements. The displacement components are given by [11]:

$$U = G\left[\frac{\zeta}{2\xi R}J_1\left(\frac{\zeta r}{\xi R}\right) - \frac{\zeta}{2R\xi}J_3\left(\frac{\zeta r}{\xi R}\right) + \frac{2B}{RA}J_2\left(\frac{\zeta r}{R}\right)\right] \quad (5)$$

-continued $$V = -H\left[\frac{2}{R}J_2\left(\frac{\zeta r}{\xi R}\right) + \frac{B\zeta}{2RA}J_1\left(\frac{\zeta r}{R}\right)\frac{B\zeta}{2RA}J_3\left(\frac{\zeta r}{R}\right)\right] \quad (6)$$

where G=ACos(2θ), H=ASin(2θ) and the $$\frac{B}{A} = -4.5236 \, [11].$$

Similar to other vibrating resonators, the equivalent RLC circuit for the wine-glass disk is governed by the total integrated kinetic energy in the resonator, its mode shape, and parameters associated with its transducer ports [9]. Using the procedure of [9], the expressions for equivalent motional resistance $R_x$, inductance $L_x$, and capacitance $C_x$ can be written as:

Motional Resistance $$R_x = \frac{\sqrt{K_r m_r}}{Q\eta^2}.$$

Motional Inductance $$L_x = \frac{m_r}{\eta^2}.$$

Motional Capacitance $$C_x = \frac{\eta^2}{K_r}.$$

where $$\eta = v_p \frac{\partial C}{\partial x}$$

is the electromechanical coupling coefficient, Q is the resonator quality factor, $V_p$ is the biasing voltage, C is the electrode-to-disk capacitance, $$\frac{\partial C}{\partial x}$$

is the integrated change in electrode-resonator capacitance per unit displacement for a single quadrant port and $m_r$ is the effective mass at the electrode location given by equation (7):

$$m_r = \frac{\rho\pi t \int_0^R \left[\frac{\zeta}{2R\xi}J_1\left(\frac{\zeta r}{\xi R}\right) - \frac{\zeta}{2R\xi}J_3\left(\frac{\zeta r}{\xi r}\right) + \frac{2B}{RA}J_2\left(\frac{\zeta r}{R}\right)\right]^2 r dr}{\left[\frac{\zeta}{2R\xi}J_1\left(\frac{\zeta}{\xi}\right) - \frac{\zeta}{2R\xi}J_3\left(\frac{\zeta}{\xi}\right) + \frac{2B}{RA}J_2(\zeta)\right]^2} \quad (7)$$

The effective stiffness $K_r$ is related to the effective mass $m_r$ by $K_r = w_o^2 m_r$ and so the equivalent circuit elements can be computed.

One important difference between the stiff, high frequency resonators of the present application and previous lower frequency ones is the difference in total energy per cycle. In particular, the peak kinetic energy per cycle can be computed via the expression:

$$KE_{peak} = \frac{1}{2}m_{re}(w_o\chi)^2 = \frac{1}{2}K_{re}\chi^2 \quad (8)$$

where X and $K_{re}$ are the peak displacement and effective stiffness, respectively, at the disk location across from the center of an electrode. Since the effective stiffness $K_{re} \cong 542{,}000$ N/m for a 73 MHz wine-glass resonator is more than 350 times the 1,500 N/m of a 10 MHz CC-beam, the former is expected to store 350 times more energy per cycle for the same displacement amplitude. With energies per cycle many times larger than those lost to viscous gas damping, the wine-glass resonator of this application, and virtually any high stiffness, high frequency mechanical resonator device (e.g. radial contour mode disks), are expected to exhibit high Q even under air-damped conditions.

In addition to the ability to store higher kinetic energy than flexural mode devices, the wine-glass mode is less vulnerable to air-damping than flexural mode devices. The surface area of the wine-glass mode disk that is expanding and thus subjected to damping force by the surrounding air pressure is much smaller than the surface area of the corresponding clamped-clamped beam that would be experiencing expansion under the same pressure.

Given the high stored kinetic energy per cycle and the reduced mechanical losses to the substrate attributed to the novel non-intrusive anchoring structure, the wine-glass resonator is expected to demonstrate exceptionally high Q in vacuum. Not only this, but for the first time ever, the wine-glass mode resonator has the potential to exhibit a relatively high Q under high operating pressure values without the need for vacuum packaging. This result will have a strong impact toward further development of cost-effective, robust MEMS resonators for commercial applications.

Self-Aligned Sub-Micron Gap Polysilicon Electrodes Disk Resonator Process

A new self-aligned batch process is developed to remedy the drawbacks of the process used to fabricate earlier radial mode disk resonators that used metal electrodes as well as a non-aligned process [9]. The non-aligned process resulted in a small yield and resonators with low quality factors. The lower Q is attributed to the finite alignment capability associated with the radial disk process thus causing the displacement of the anchoring point from the radial mode nodal point. Moreover, a low pull in voltage experienced was attributed to the soft metal electrodes [9] compared to polysilicon electrodes.

To mitigate these problems, a novel, self-aligned process was developed. This process defines the anchoring point in the same step where the disk structure is defined to insure the alignment of the anchor to the disk nodal points. In conjunction with the self-alignment feature, the process utilizes rigid doped polysilicon electrodes for added stiffness and compatibility with CMOS circuitry processes. Altogether combined with the new concept of a shielding ground plane to reduce the parasitic capacitances and hence reduce noise levels is expected to boost the performance of the designed devices.

Figure 7:
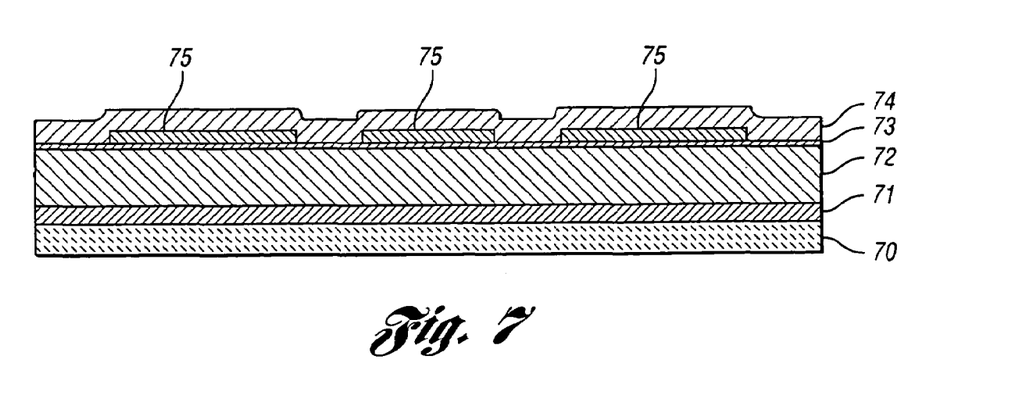
FIG. 7 is a cross-sectional view showing the sacrificial oxide deposited after patterning the doped polysilicon interconnect layer.

Referring now to FIG. 7, the process starts by forming an n+ blanket layer in a blank silicon wafer 70 using phosphorus doping at 950° C. to form the shielding ground plane 71. Following the diffusion step, the process proceeds to create a passivation layer to isolate devices and interconnects from the formed shielding plane 71. Specifically, a 2 $\mu$m thick oxide film 72, followed by a 3000 Å thick film 73 of LPCVD stoichiometric silicon nitride are deposited. These two layers 72 and 73 serve as the isolation compound material. Contact openings to the shielding ground plane are then etched through the oxide and nitride layers 72 and 73, respectively, to provide access to appropriate biasing potential. Polysilicon is then deposited via LPCVD, doped and then patterned to form the bonding pads and interconnects 75. A 6000 Å of LPCVD high temperature oxide (HTO) is deposited to serve as a sacrificial oxide 74 that temporarily supports the structural polysilicon layer during its own deposition and patterning. FIG. 7 shows a cross-section in the wine-glass mode disk 10 presented in FIG. 3 after depositing the sacrificial oxide layer 74.

Figure 8A:
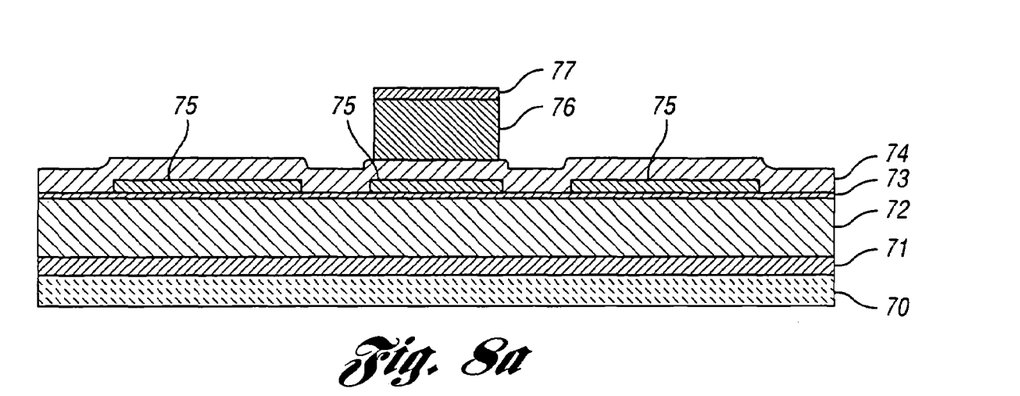
FIGS. 8a and 8b are a cross-sectional views taken along lines 8a–8a and 8b–8b in FIG. 3 showing the self-aligned etching of the structural polysilicon to form the disk structure as well as the anchors in the same step.
Figure 8B:
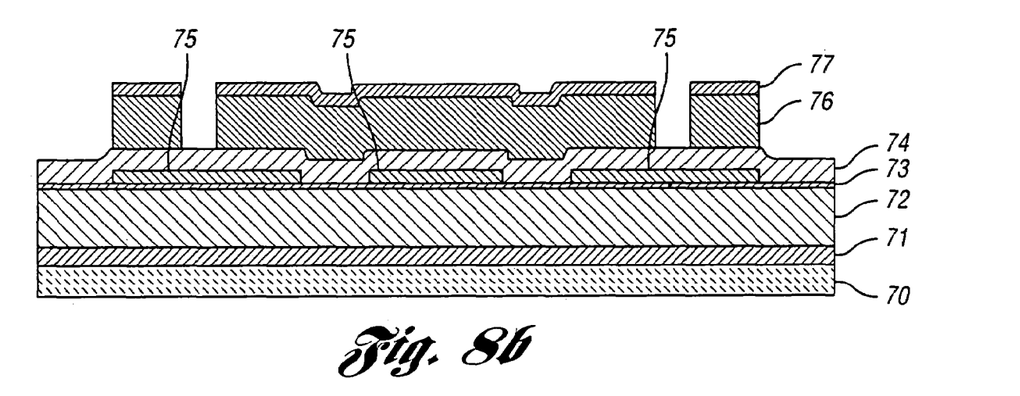

Referring now to FIGS. 8a and 8b, low stress fine grain polysilicon 76 is then deposited via LPCVD at 580° C. to a thickness of 2 $\mu$m. This structural polysilicon 76 is doped using phosphorus chloride at 950° C. The doped structural polysilicon 76 is capped with a 4000 Å thick film 77 of HTO that serves as a hard mask 77 during etching the structural polysilicon. The oxide mask. 77 is then patterned and plasma etched to the desired device geometries, and these patterns are then transferred to the underlying structural polysilicon layer 76 using high density plasma RIE etching. The structural polysilicon etching step is the self-aligned step, where the anchoring points located at the mode nodal points 8 along the disk perimeter and at the disk center are defined simultaneously as the disk body 10 is being etched. This guarantees that the anchoring points are always located at the mode nodal points 8 irrespective to any lithographic tolerances or misalignment. FIGS. 8a and 8b present a cross-section of a device after the structural polysilicon etch step showing clearly the anchoring points aligned to the disk body 10 thus avoiding any displacement of the anchoring points from the mode nodal axes 18 shown in FIG. 3. The capacitive gap between the disk 10 and the input/output electrodes 14 and 16, respectively, is now defined.

Figure 9:
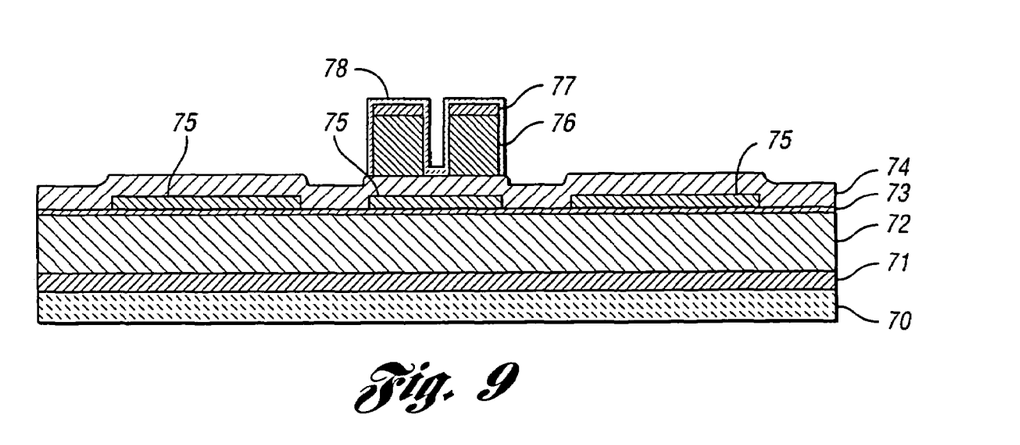
FIG. 9 is a cross-sectional view showing the deposition of the capacitive gap defining oxide layer using the sub-micron gap defining processing noted earlier [13] where a conformal 1000 Å of HTO is deposited along the top and side walls of the patterned polysilicon disk.
Figure 10:
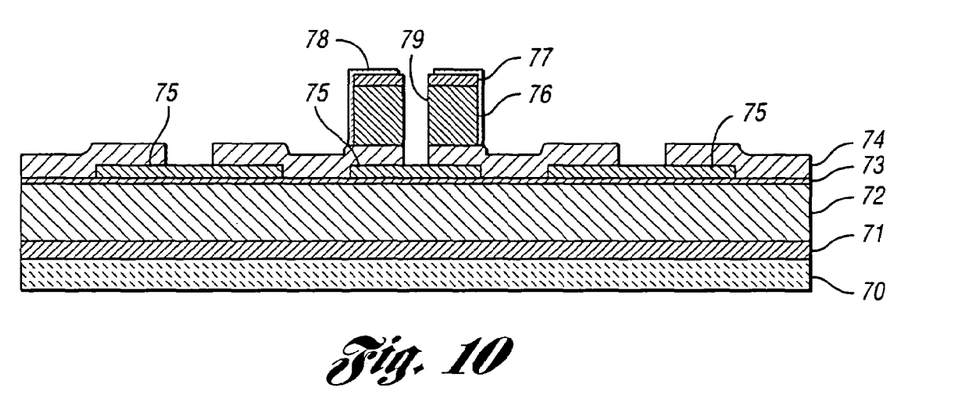
FIG. 10 is a cross-sectional view showing the anchor opening through the capacitive gap oxide layer and through the sacrificial oxide layer.

Referring now to FIG. 9, the deposited spacer oxide 78 is then patterned such that it will be etched at the anchoring points. A combination of wet and dry etching is used to etch the spacer oxide 78 as well as the sacrificial oxide layer 74 underlying the structural polysilicon 76 to expose the interconnects polysilicon layer 75, as shown in FIG. 10.

A third low stress polysilicon layer is then deposited to refill the stem opening 79 as well as the side anchors connecting them to the interconnects polysilicon layer 75. In addition to refilling the stem and anchor openings to make electrical contact as well as mechanical anchoring, the deposited polysilicon layer serves as the structural layer for the excitation and sense electrodes 81 surrounding the disk structure shown earlier in FIG. 3. The polysilicon electrode layer 75 is capped by a 6000 Å of HTO oxide hard mask after being doped. The oxide mask 77 is then patterned and plasma etched, the desired geometries are then transferred to the electrode polysilicon layer 75 by means of high density RIE.

Figure 11:
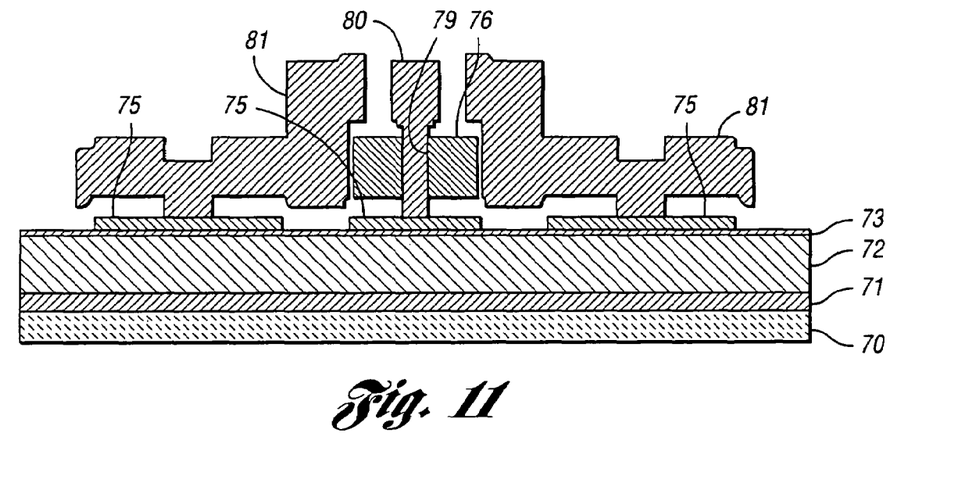
FIG. 11 is a cross-sectional view showing the sacrificial oxide deposited after patterning the doped polysilicon electrode layer taken along line 11—11 in FIG. 3.

The final structure is then released in straight HF for 15 minutes. FIG. 11 shows a cross-section of the released structure showing a section of the device at the center anchor 80 with the overhanging excitation and sense electrodes 81 separated from the device by the capacitive gap defined earlier by means of the oxide spacer 78 that is etched away during the release step.

Figure 12:
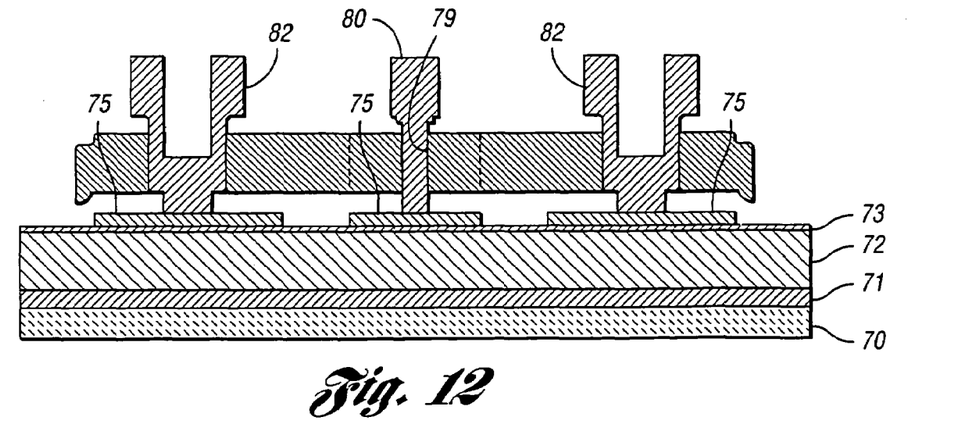
FIG. 12 is a cross-sectional view showing the self-aligned etching of the structural polysilicon to form the disk structure taken along line 12—12 in FIG. 3.

FIG. 12 shows a different cross-section of the device presenting the anchoring structure at the center (i.e., stem anchor 80) and along the device outer perimeter (i.e., anchors 82). As seen, the final polysilicon layer refilled the self-aligned anchor holes etched through the structural polysilicon layer and through the underlying sacrificial oxide layer 72 making electrical contact as well as mechanical rigid suspension between the structural polysilicon and interconnect polysilicon layers. This way, the anchoring points are exactly located at the mode nodal points 8 irrespective to any alignment mismatches during fabrication.

A totally new class of disk resonators operating at the lowest order vibration mode (known as the wine-glass mode) with an innovative non-intrusive anchoring structures strategically located at the mode nodal points 8 is described above. This type of anchoring scheme serves to reduce the mechanical losses to the substrate and hence increase the overall quality factor that reflects on reducing the motional resistance by an order of magnitude compared to radial mode disk resonator biased at the same DC voltage. In addition, this anchoring structure enforces the desired mode and suppresses higher order modes providing excellent isolation between different resonant modes.

An innovative self-aligned process that incorporates doped polysilicon electrodes was developed to fabricate the new wine-glass mode disk resonators. The self-alignment feature insures the alignment of the supporting structure to the mode nodal points. Fabricated resonators with five anchor points showed quality factors in the mere of 4000 in vacuum pressure and 2500 in atmospheric pressure. This demonstrates the capability of RF MEMS to operate with acceptable performance without the need for sophisticated and expensive vacuum packaging. By eliminating some anchoring points, the Q's went up significantly to about 98,000 in vacuum and 9,800 in atmosphere. This is the first time ever to report such Q's achieved by micromechanical resonators at IF frequencies under the mentioned operational environmental conditions. Different variations of the anchoring structure can be used like two axi-symmetric anchors 12 holding the disk 10. Moreover, only one side anchor can be used to hold the disk 10 while a levitation pad (not shown) located under the disk 10 can be used to reduce the load on the single anchor by biasing the pad and the disk 10 at the same DC bias to create the levitation force.

The higher frequency 195 MHz wine-glass mode disk resonators demonstrated the ability of the new wine-glass mode disk resonators designed with the innovative non-intrusive anchoring structure to retain their high Q's when scaled down in size to resonate at higher operational frequencies.

The implications of these results are important, as they effectively state that expensive vacuum packaging is no longer needed to maintain exceptional Q's exhibited by frequency vibrating micromechanical resonators, a fact that stands to substantially lower the cost of devices based on vibrating RF MEMS technology, making them clear winners in many communications applications. More work still to come to extend the current results to RF frequencies required for a large segment of the wireless market such as the new CDMA direct conversion receivers operating at about 2 GHz. The demonstrated high Q's can be achieved at higher frequencies by using different structural materials such as diamond or silicon carbide or by using other higher order modes that are compatible with both the non-intrusive anchoring structure and split electrode configuration.

Figure 1:
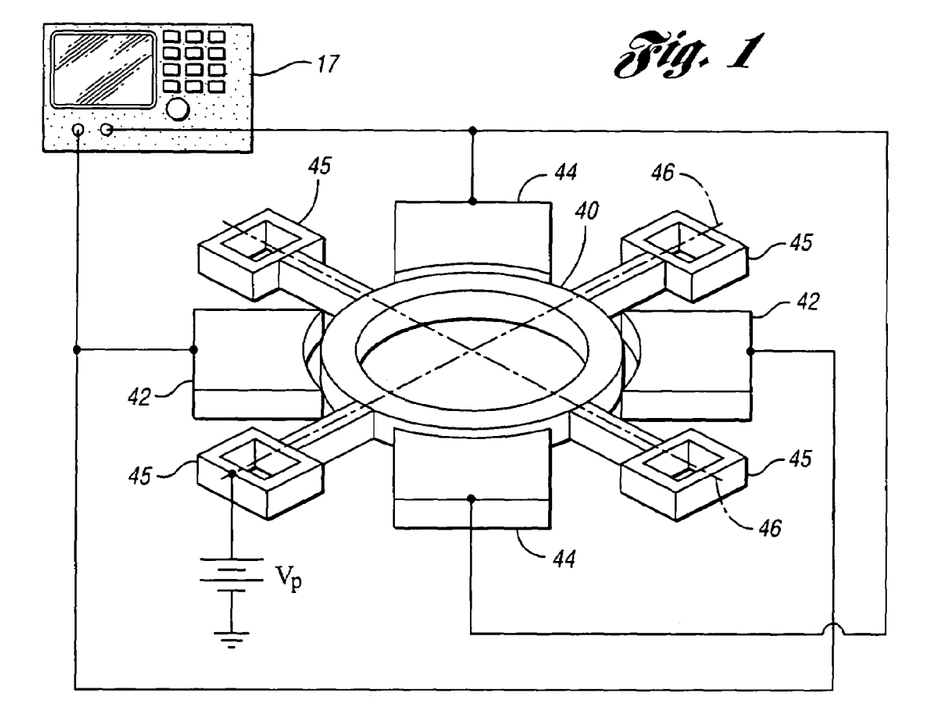
FIG. 1 is a perspective, schematic view of a wine-glass ring mode ring resonator with four anchors in a typical two-port bias and excitation configuration.
Figure 6:
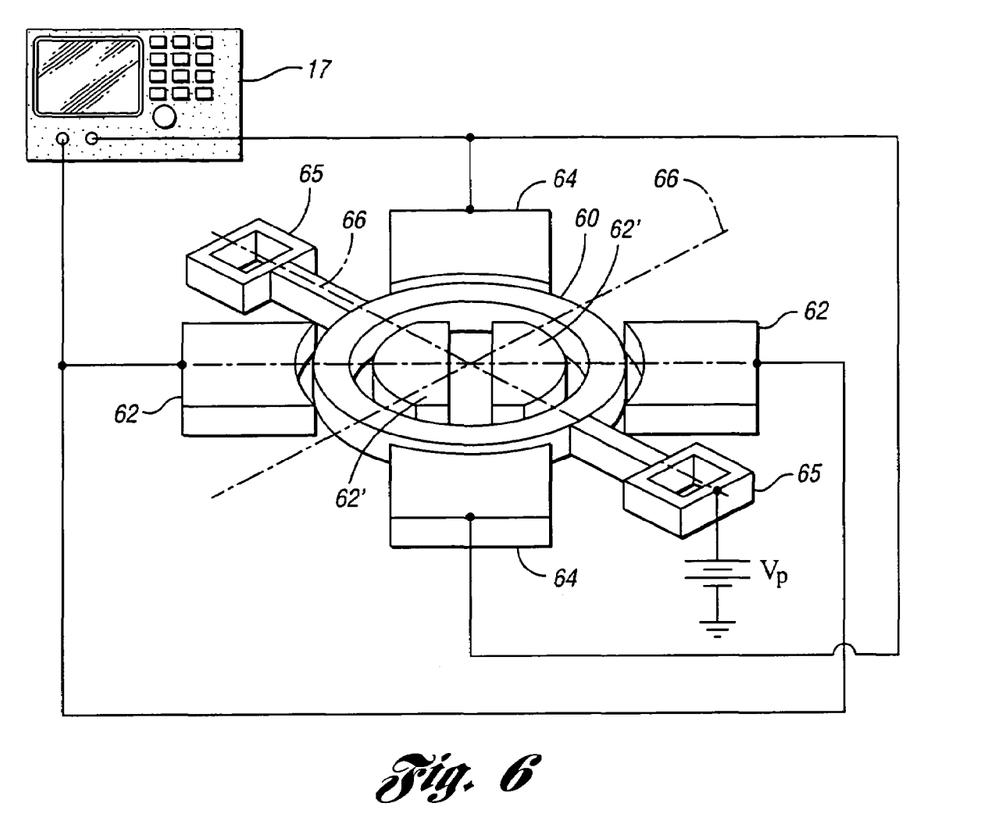
FIG. 6 is a perspective, schematic view of a wine-glass ring mode resonator with two anchors in a bias and excitation configuration with inner and outer drive electrodes.

The developed anchoring structure is a key feature for developing other high Q extensional mode devices like the extensional compound mode ring resonators of FIGS. 1 and 6 and other compound mode disk resonators. FIG. 1 shows a ring resonator 40, input electrodes 42, output electrodes 44, four anchors 45, the network analyzer 17 and nodal axes 46 (also shown in FIG. 2).

FIG. 6 shows a ring resonator 60, outer and inner input electrodes 62 and 62', respectively, output electrodes 64, two anchors 65, the network analyzer 17 and nodal axes 66.

These devices, when anchored using the non-intrusive anchoring structure, should be able to exhibit performance similar to that demonstrated by the wine-glass mode disk resonators at other frequency ranges. In particular, 10 MHz is of importance to meet the ERC requirements and 1.2 GHz for wireless system applications. At the low frequency end, the physical size of the wine-glass mode disk will be very large leading to fabrication problems, especially during the release step. While at higher frequency bands, the size of the disk will be very small making it hard to fabricate. Hence, other structures that are derivatives of the wine-glass mode disk can operate at these frequency ranges while maintaining similar performance to the wine-glass mode disk resonator.

Wine-Glass Mode Ring Resonator for Low IF Band

Figure 2:
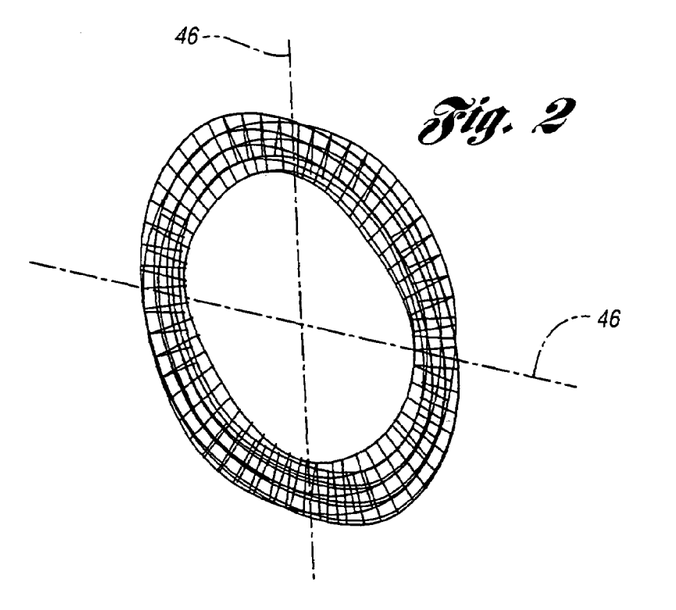
FIG. 2 is a wine-glass ring mode shape computed by a FEM ANSYS package.

The lowest order extensional compound mode for a ring resonator is similar in shape to the wine-glass vibration mode of a disk. The wine-glass mode ring resonator is a miniaturization concept to demonstrate performance similar to that of the wine-glass mode disk resonator at a much lower frequency while maintaining the same physical size of the disk. FIG. 2 shows the mode shape for the ring resonator obtained by the finite element analysis using the commercial package Ansys. As seen, the ring resonator has a wine-glass mode identical to that of the wine-glass mode disk with two orthogonal nodal axes. Hence, the non-intrusive anchoring designed for the disk can be used to support the ring resonator. FIG. 1 shows a perspective view of the proposed wine-glass mode ring resonator 40 with the supporting structure 45 and the excitation/sense electrodes 42 and 44, respectively.

The frequency equation for the ring resonator is given by $$\omega_o^2 = \frac{n^2(n^2-1)^2 E(R_{outer} - R_{inner})^2}{(n^2+1)\rho R_{outer}^4} \quad (9)$$

where $\omega_o$ is the natural angular frequency, $\rho$ and E are the density and the Young's modulus of elasticity of the ring material, respectively, $R_{outer}$ is the ring outer radius, $R_{inner}$ is the ring inner radius and n is mode order (for the wine-glass mode, n=2) [14].

The ring resonator is fabricated using the same self-aligned process developed earlier for the wine-glass mode disk resonator. An increase in the motional resistance of this ring resonator is expected compared to the wine-glass mode disk mainly due to:

Increase in the air damping forces acting on the inner and outer moving surfaces of the ring resonator. This will reflect on reducing the overall Q and hence increases the motional resistance.

Reduction in stored kinetic energy which will reflect on reducing the Q and hence increase $R_x$.

To alleviate this problem, an inner set of electrodes (i.e., electrodes 62' in FIG. 6) are added to increase the electro-mechanical coupling coefficient η and hence reduce the motional resistance.

The wine-glass mode ring resonator can be also anchored using three, two and even one side anchor. Any combination of anchor locations can be used, that is axi-symmetric or mirror symmetric.

Triangular Mode Disk Resonator for Radio Frequency Range

Figure 5:
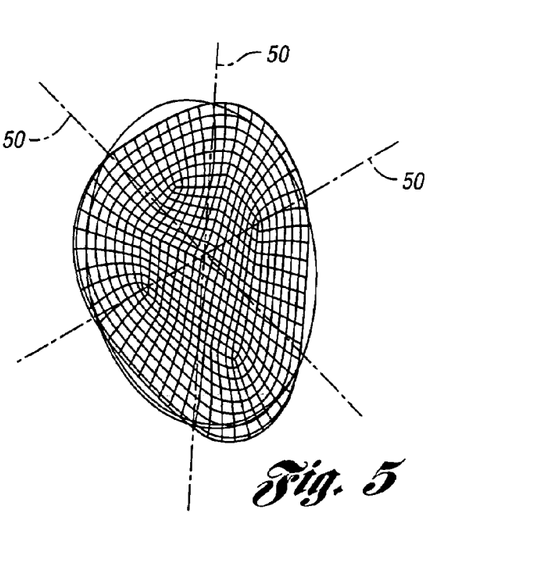
FIG. 5 is a triangular disk mode shape computed by the FEM ANSYS package.

Triangular mode disk resonator is a higher order compound mode [11] with mode shape shown in FIG. 5 with mode nodal axes 50. This mode scales the frequency by a factor of 2x higher than the wine-glass mode, making it a good choice to design a higher frequency device that works at the 1.2 GHz range. This device is expected to exhibit at higher frequencies the following:

Demonstrate high Q's without the need for vacuum packaging.

Have higher power handling capability than the radial mode disk.

Good thermal stability specially by reducing the number of anchor points.

A triangular mode device was fabricated using the self-aligned process in the same run with the wine-glass mode ring resonator. This is an example of the higher order compound mode disk which exists also in the ring resonator.

In summary, the following features of the present invention have been described:

New wine-glass mode disk resonator.

Development and the establishment of the foundation for developing other derivatives of the wine-glass mode disk resonator capable of exhibiting high Q under atmospheric pressure.

Novel self-aligned non-intrusive anchoring structure that minimizes mechanical losses to the substrate and hence boosts the overall Q. The anchoring structure can hold the device at only one nodal point bringing the losses to an absolute minimum.

Innovative self-aligned IC compatible fabrication process. This process can be used to fabricate other extensional devices and other micromachined sensors and resonators.

Split electrode configuration necessary to excite the compound modes in extensional mode disks, rings and other extensional mode devices.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A micromechanical resonator device having a desired mode shape, the device comprising:
   a substrate;
   a resonator having a stationary surface area wherein the desired mode shape is characterized by a plurality of peripheral nodal points located about a periphery of the resonator and wherein the desired mode shape involves movement of only a fraction of the stationary surface area at resonance; and
   a non-intrusive support structure anchored to the substrate to support the resonator above the substrate and attached to the resonator at at least one of the peripheral nodal points to reduce mechanical losses to the substrate.

2. The device as claimed in claim 1, further comprising a drive electrode structure adjacent the resonator for driving the resonator so that the resonator changes shape at resonance.

3. The device as claimed in claim 1, wherein the resonator is an extensional mode device having a compound mode that involves both radial and tangential displacement.

4. The device as claimed in claim 3, wherein the resonator is a disk resonator.

5. The device as claimed in claim 4, wherein the disk resonator is a solid disk resonator.

6. The device as claimed in claim 3, wherein the resonator is a ring resonator.

7. The device as claimed in claim 1, wherein the non-invasive support structure forces the resonator to vibrate in the desired mode shape while suppressing any undesired mode shapes.

8. The device as claimed in claim 1, wherein the desired mode shape is a compound mode shape such as a wine-glass mode shape or a triangular mode shape.

9. The device as claimed in claim 1, further comprising a drive electrode structure formed on the substrate at a position to allow electrostatic excitation of the resonator so that the resonator is driven in the desired mode shape and wherein the resonator and the drive electrode structure define a capacitive gap therebetween.

10. The device as claimed in claim 9, wherein the drive electrode structure is disposed about the periphery of the resonator.

11. The device as claimed in claim 9, wherein the capacitive gap is a sub-micron, lateral, capacitive gap.

12. The device as claimed in claim 9, wherein the drive electrode structure includes a plurality of split electrodes.

13. The device as claimed in claim 9, further comprising a sense electrode structure formed on the substrate at a position to sense output current based on motion of the resonator.

14. The device as claimed in claim 13, wherein the drive electrode structure includes a plurality of separate input drive electrodes and the sense electrode structure includes a plurality of separate output sense electrodes.

15. The device as claimed in claim 9, wherein the resonator is a ring resonator having inner and outer peripheries and wherein the drive electrode structure includes inner and outer sets of electrodes disposed about the inner and outer peripheries, respectively.

16. The device as claimed in claim 1, wherein the support structure includes a plurality of anchors positioned about the periphery of the resonator.

17. The device as claimed in claim 1, wherein the device is diamond-based, silicon carbide-based or a composite material having high acoustic velocity.

18. The device as claimed in claim 1, wherein the device is silicon-based or a composite material having high acoustic velocity.

19. The device as claimed in claim 1, wherein the desired mode shape is a triangular disk mode shape.

20. The device as claimed in claim 1, wherein the desired mode shape is a wine-glass ring mode shape.

21. The device as claimed in claim 1, wherein the desired mode shape is further characterized by a central nodal point which corresponds to a center of the resonator and wherein the central nodal point and a pair of the peripheral nodal points are disposed on a nodal axis having substantially no radial displacement at resonance.

* * * * *